(12) United States Patent
Kim

(10) Patent No.: US 9,502,416 B1
(45) Date of Patent: Nov. 22, 2016

(54) SEMICONDUCTOR DEVICE INCLUDING TRANSISTORS HAVING DIFFERENT THRESHOLD VOLTAGES

(71) Applicant: SAMSUNG ELECTRONICS CO., LTD., Suwon-si, Gyeonggi-do (KR)

(72) Inventor: Ju-Youn Kim, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/990,992

(22) Filed: Jan. 8, 2016

(30) Foreign Application Priority Data

Jun. 4, 2015 (KR) .................. 10-2015-0079013

(51) Int. Cl.
| | | |
|---|---|---|
| *H01L 27/092* | (2006.01) | |
| *H01L 29/49* | (2006.01) | |
| *H01L 27/108* | (2006.01) | |
| *H01L 27/11* | (2006.01) | |
| *H01L 29/423* | (2006.01) | |

(52) U.S. Cl.
CPC ......... *H01L 27/0922* (2013.01); *H01L 27/108* (2013.01); *H01L 27/1104* (2013.01); *H01L 29/42368* (2013.01); *H01L 29/4966* (2013.01)

(58) Field of Classification Search
CPC ............. H01L 27/0922; H01L 27/108; H01L 29/42368; H01L 29/4966; H01L 27/1104
See application file for complete search history.

(56) References Cited

U.S. PATENT DOCUMENTS

| | | | |
|---|---|---|---|
| 6,392,280 B1 | 5/2002 | Besser et al. | |
| 6,436,840 B1 | 8/2002 | Besser et al. | |
| 6,440,867 B1 | 8/2002 | Besser et al. | |
| 6,440,868 B1 | 8/2002 | Besser et al. | |
| 6,528,362 B1 | 3/2003 | Besser et al. | |
| 6,589,866 B1 | 7/2003 | Besser et al. | |
| 6,642,590 B1 | 11/2003 | Besser et al. | |
| 7,915,167 B2 | 3/2011 | Radosavljevic et al. | |
| 8,252,649 B2 | 8/2012 | Stahrenberg et al. | |
| 8,349,678 B2 | 1/2013 | Chuang et al. | |
| 8,354,309 B2 | 1/2013 | Greene et al. | |
| 8,357,604 B2 | 1/2013 | Hoentschel et al. | |
| 8,546,252 B2 | 10/2013 | Anderson et al. | |
| 8,658,497 B2 | 2/2014 | Shroff et al. | |
| 8,786,028 B2 | 7/2014 | Hong et al. | |
| 8,906,764 B2 | 12/2014 | Shroff et al. | |
| 2013/0249003 A1 | 9/2013 | Oh et al. | |
| 2014/0061814 A1 | 3/2014 | Kim et al. | |
| 2014/0117466 A1* | 5/2014 | Jagannathan ... H01L 21/823842 257/411 | |
| 2014/0220770 A1 | 8/2014 | Stahrenberg et al. | |
| 2015/0021699 A1 | 1/2015 | Ando et al. | |

\* cited by examiner

*Primary Examiner* — Roy Potter
*Assistant Examiner* — Paul Patton
(74) *Attorney, Agent, or Firm* — Lee & Morse P.C.

(57) ABSTRACT

A semiconductor device includes first through fourth areas, first through fourth gate stacks, the first gate stack includes a first high-dielectric layer, a first TiN layer to contact the first high-dielectric layer, and a first gate metal on the first TiN layer, the second gate stack includes a second high-dielectric layer, a second TiN layer to contact the second high-dielectric layer, and a second gate metal on the second TiN layer, the third gate stack includes a third high-dielectric layer, a third TiN layer to contact the third high-dielectric layer, and a third gate metal on the third TiN layer, and the fourth gate stack includes a fourth high-dielectric layer, a fourth TiN layer to contact the fourth high-dielectric layer, and a fourth gate metal on the fourth TiN layer, the first through fourth thicknesses of the TiN layers being different.

20 Claims, 22 Drawing Sheets

1200

1300

1400

US 9,502,416 B1

SEMICONDUCTOR DEVICE INCLUDING TRANSISTORS HAVING DIFFERENT THRESHOLD VOLTAGES

CROSS-REFERENCE TO RELATED APPLICATION

This application claims priority under 35 U.S.C. §119 to Korean Patent Application No. 10-2015-0079013, filed on Jun. 4, 2015, in the Korean Intellectual Property Office, the contents of which are herein incorporated by reference in their entirety.

BACKGROUND

1. Technical Field

Example embodiments relate to a semiconductor device including transistors having different threshold voltages.

2. Description of the Related Art

A semiconductor device may include transistors having different threshold voltages. The transistors having different threshold voltages may be, e.g., a combination of a logic transistor and a static random access memory (SRAM) or dynamic random access memory (DRAM) transistor. Various methods of controlling threshold voltages of transistors included in a semiconductor device are being researched.

SUMMARY

Aspects of embodiments provide a semiconductor device having threshold voltages of a plurality of transistors controlled.

According to an aspect of embodiments, there is provided a semiconductor device including a substrate including a first, a second, a third, a fourth areas, a first, a second, a third, a fourth gate stacks which are formed on the first through fourth areas of the substrate, respectively, wherein the first gate stack includes a first high-dielectric constant (k) layer which is formed on the substrate, a first TiN layer which is formed on the first high-k layer to contact the first high-k layer and has a first thickness and a first gate metal which is formed on the first TiN layer, the second gate stack includes a second high-k layer which is formed on the substrate, a second TiN layer which is formed on the second high-k layer to contact the second high-k layer and has a second thickness and a second gate metal which is formed on the second TiN layer, the third gate stack includes a third high-k layer which is formed on the substrate, a third TiN layer which is formed on the third high-k layer to contact the third high-k layer and has a third thickness and a third gate metal which is formed on the third TiN layer, and the fourth gate stack includes a fourth high-k layer which is formed on the substrate, a fourth TiN layer which is formed on the fourth high-k layer to contact the fourth high-k layer and has a fourth thickness and a fourth gate metal which is formed on the fourth TiN layer, wherein the first through fourth thicknesses are different.

In some embodiments, the first and second areas are n-channel field effect transistor (NFET) areas, the third and fourth areas are p-channel field effect transistor (PFET) areas, and the first and second thicknesses are smaller than the third and fourth thicknesses.

In some embodiments, the first gate metal includes a first TiAlC layer, a first barrier layer and a first metal layer, the second gate metal includes a second TiAlC layer, a second barrier layer and a second metal layer, the third gate metal includes a third TiAlC layer, a third barrier layer and a third metal layer, and the fourth gate metal includes a fourth TiAlC layer, a fourth barrier layer and a fourth metal layer.

In some embodiments, the first TiAlC layer contacts the first TiN layer, the second TiAlC layer contacts the second TiN layer, the third TiAlC layer contacts the third TiN layer, and the fourth TiAlC layer contacts the fourth TiN layer.

In some embodiments, the first through fourth gate metals do not include lanthanum (La) and tantalum nitride (TaN).

In some embodiments, the semiconductor device further includes first through fourth interface layers which are formed between the substrate and the first through fourth high-k layers, respectively.

In some embodiments, the first through fourth gate stacks form first through fourth transistors, respectively, and wherein the first through fourth transistors have different threshold voltages.

In some embodiments, the respective threshold voltages of the first and second transistors in the first and second areas increase as the first and second TiN layers become thicker, and the respective threshold voltages of the third and fourth transistors in the third and fourth areas decrease as the third and fourth TiN layers become thicker.

In some embodiments, the first through fourth high-k layers extend upward along bottom and sidewalls of the first through fourth metal gate stacks, respectively.

According to another aspect of embodiments, there is provided a semiconductor device including a substrate which includes a low-voltage area and a high-voltage area, first and third gate stacks which are formed on the low-voltage area and second and fourth gate stacks which are formed on the high-voltage area, wherein the first gate stack includes a first high-k layer which is formed on the substrate, a first TiN layer which is formed on the first high-k layer to contact the first high-k layer and has a first thickness and a first gate metal which is formed on the first TiN layer, the second gate stack includes a second high-k layer which is formed on the substrate, a second TiN layer which is formed on the second high-k layer to contact the second high-k layer and has a second thickness greater than the second thickness and a second gate metal which is formed on the second TiN layer, the third gate stack includes a third high-k layer which is formed on the substrate, a third TiN layer which is formed on the third high-k layer to contact the third high-k layer and has a third thickness greater than the second thickness and a third gate metal which is formed on the third TiN layer, and the fourth gate stack includes a fourth high-k layer which is formed on the substrate, a fourth TiN layer which is formed on the fourth high-k layer to contact the fourth high-k layer and has a fourth thickness greater than the second thickness and smaller than the third thickness and a fourth gate metal which is formed on the fourth TiN layer.

In some embodiments, the first gate metal includes a first TiAlC layer, a first barrier layer and a first metal layer, the second gate metal includes a second TiAlC layer, a second barrier layer and a second metal layer, the third gate metal includes a third TiAlC layer, a third barrier layer and a third metal layer, and the fourth gate metal includes a fourth TiAlC layer, a fourth barrier layer and a fourth metal layer.

In some embodiments, the first TiAlC layer contacts the first TiN layer, the second TiAlC layer contacts the second TiN layer, the third TiAlC layer contacts the third TiN layer, and the fourth TiAlC layer contacts the fourth TiN layer.

In some embodiments, the first through fourth gate metals do not include lanthanum (La) and tantalum nitride (TaN).

In some embodiments, the first through fourth gate stacks form first through fourth transistors having different threshold voltages, respectively, the first and second transistors are n-channel field effect transistor (NFET), and the second and fourth transistors are p-channel field effect transistor (PFET).

In some embodiments, the respective threshold voltages of the first and second transistors increase as the first and second TiN layers become thicker, and the respective threshold voltages of the third and fourth transistors decrease as the third and fourth TiN layers become thicker.

According to yet another aspect of embodiments, there is provided a semiconductor device including a first through fourth transistors, wherein the first transistor includes a first interface layer, a first high-k layer which is formed on the first interface layer, a first TiN layer which is formed on the first high-k layer to contact the first high-k layer and has a first thickness and a first gate metal which is formed on the first TiN layer, the second transistor includes a second interface layer, a second high-k layer which is formed on the second interface layer, a second TiN layer which is formed on the second high-k layer to contact the second high-k layer and has a second thickness greater than the first thickness and a second gate metal which is formed on the second TiN layer, the third transistor includes a third interface layer, a third high-k layer which is formed on the third interface layer, a third TiN layer which is formed on the third high-k layer to contact the third high-k layer and has a third thickness greater than the second thickness and a third gate metal which is formed on the third TiN layer, and the fourth transistor includes a fourth interface layer, a fourth high-k layer which is formed on the fourth interface layer, a fourth TiN layer which is formed on the fourth high-k layer to contact the fourth high-k layer and has a fourth thickness greater than the second thickness and smaller than the third thickness and a fourth gate metal which is formed on the fourth TiN layer, and wherein the first through fourth gate metals do not include lanthanum (La) and tantalum nitride (TaN).

In some embodiments, the first and second transistors are n-channel field effect transistor (NFET), the second and fourth transistors are p-channel field effect transistor (PFET), and a threshold voltage of the second transistor is higher than a threshold voltage of the first transistor, and a threshold voltage of the fourth transistor is higher than a threshold voltage of the third transistor.

In some embodiments, the first gate metal includes a first TiAlC layer, a first barrier layer and a first metal layer, the second gate metal includes a second TiAlC layer, a second barrier layer and a second metal layer, the third gate metal includes a third TiAlC layer, a third barrier layer and a third metal layer, and the fourth gate metal includes a fourth TiAlC layer, a fourth barrier layer and a fourth metal layer.

In some embodiments, the respective threshold voltages of the first through fourth transistors increase as the first through fourth TiN layers become thicker.

In some embodiments, the respective threshold voltages of the first through fourth transistors decrease as the first through fourth TiN layers become thicker.

BRIEF DESCRIPTION OF THE DRAWINGS

The above and other aspects and features will become more apparent by describing in detail exemplary embodiments with reference to the attached drawings, in which.

DETAILED DESCRIPTION OF THE EMBODIMENTS

Figure 1:
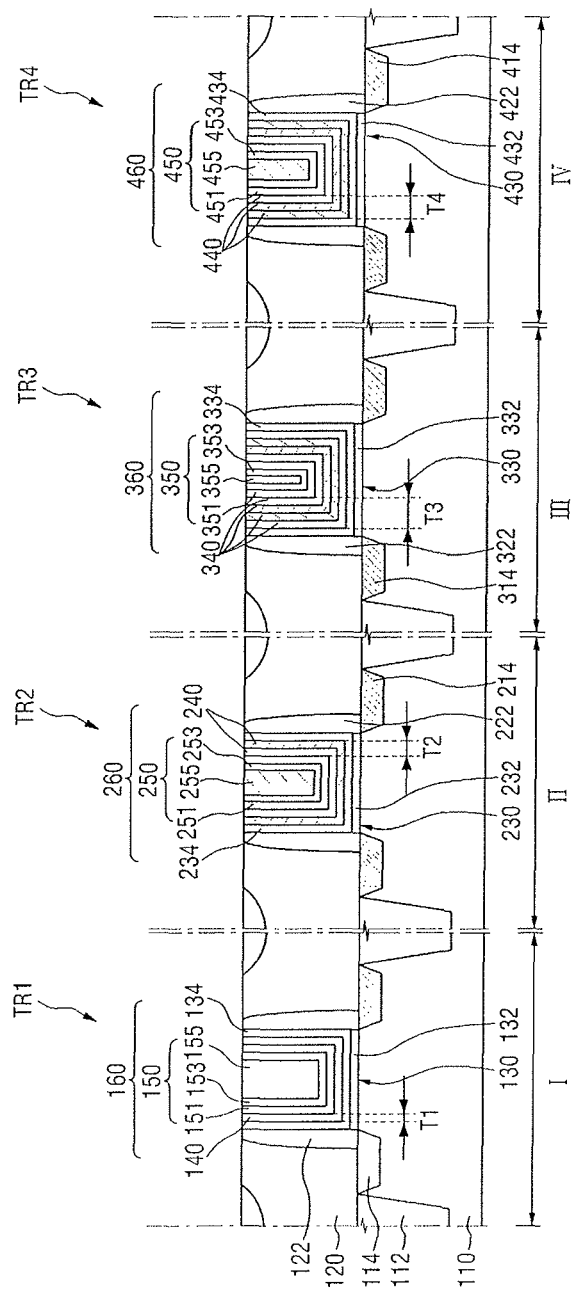
FIG. 1 is a cross-sectional view of a semiconductor device 1 according to an embodiment.

Advantages and features of embodiments and methods of accomplishing the same may be understood more readily by reference to the following detailed description of preferred embodiments and the accompanying drawings. The embodiments may, however, be embodied in many different forms and should not be construed as being limited to those set forth herein. Rather, these embodiments provide thorough and complete disclosure that will fully convey exemplary implementations to those skilled in the art, and the embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the embodiments.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a cross-sectional view of a semiconductor device according to an embodiment.

Referring to FIG. 1, a substrate 110 of the semiconductor device 1 may include first through fourth areas I through IV.

Here, the substrate 110 may be, for example, a bulk silicon substrate or a silicon-on-insulator (SOI) substrate. Otherwise, the substrate 110 may be a silicon substrate or may be a substrate made of another material such as silicon germanium, indium antimonide, lead telluride, indium arsenide, indium phosphide, gallium arsenide, or gallium antimonide.

Alternatively, the substrate 110 may include, e.g., consist of, a base substrate and an epitaxial layer formed on the base substrate. If the epitaxial layer formed on the base substrate is to be used to form active fins, it may include an element semiconductor material such as silicon or germanium. In addition, the epitaxial layer may include a compound semiconductor such as a group IV-IV compound semiconductor or a group III-V compound semiconductor. Specifically, the group IV-IV compound semiconductor that forms the epitaxial layer may be a binary or ternary compound containing two or more of carbon (C), silicon (Si), germanium (Ge) and tin (Sn) or a compound obtained by doping the binary or ternary compound with a group IV element. The group III-V compound semiconductor that forms the epitaxial layer may be a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

In the current embodiment, first through fourth transistors TR1 through TR4 may be formed in the first through fourth areas I through IV of the substrate 110, respectively, as illustrated in FIG. 1. The first through fourth transistors TR1 through TR4 may be divided by a device isolation layer 112 formed in the substrate 110. The device isolation layer 112 may be, for example, a shallow trench isolation (STI) layer.

If the substrate 110 includes active fins formed by patterning the epitaxial layer on the base substrate as described above, the device isolation layer 112 may be a deep trench isolation (DTI) layer. That is, the device isolation layer 112 according to embodiments is not limited to the one illustrated in the drawing.

The first through fourth transistors TR1 through TR4 may include first through fourth source-drain regions 114 through 414, first through fourth spacers 122 through 422, first through fourth interface layers 132 through 432, and first through fourth gate stacks 160 through 460, respectively.

Specifically, the first transistor TR1 formed in the first area I of the substrate 110 may include the first source-drain regions 114, the first spacers 122, the first interface layer 132, and the first gate stack 160. Here, the first gate stack 160 may include a first high-dielectric constant (k) layer 134, a first TiN layer 140 having a first thickness T1, and a first gate metal 150. In addition, the first gate metal 150 may include a first TiAlC layer 151, a first barrier layer 153, and a first metal layer 155.

The second transistor TR2 formed in the second area II of the substrate 110 may include the second source-drain regions 214, the second spacers 222, the second interface layer 232, and the second gate stack 260. Here, the second gate stack 260 may include a second high-k layer 234, a second TiN layer 240 having a second thickness T2, and a second gate metal 250. In addition, the second gate metal 250 may include a second TiAlC layer 251, a second barrier layer 253, and a second metal layer 255.

The third transistor TR3 formed in the third area III of the substrate 110 may include the third source-drain regions 314, the third spacers 322, the third interface layer 332, and the third gate stack 360. Here, the third gate stack 360 may include a third high-k layer 334, a third TiN layer 340 having a third thickness T3, and a third gate metal 350. In addition, the third gate metal 350 may include a third TiAlC layer 351, a third barrier layer 353, and a third metal layer 355.

The fourth transistor TR4 formed in the fourth area IV of the substrate 110 may include the fourth source-drain regions 414, the fourth spacers 422, the fourth interface layer 432, and the fourth gate stack 460. Here, the fourth gate stack 460 may include a fourth high-k layer 434, a fourth TiN layer 440 having a fourth thickness T4, and a fourth gate metal 450. In addition, the fourth gate metal 450 may include a fourth TiAlC layer 451, a fourth barrier layer 453, and a fourth metal layer 455.

The first through fourth source-drain regions 114 through 414 may be formed by injecting predetermined impurities into the substrate 110. If the first through fourth transistors TR1 through TR4 according to the current embodiment are n-channel metal oxide semiconductor (NMOS) transistors, n-type impurities may be injected to form the first through fourth source-drain regions 114 through 414.

Although not specifically illustrated in the drawing, the first through fourth source-drain regions 114 through 414 may be elevated source-drain regions. In this case, each of the first through fourth source-drain regions 114 through 414 may be formed in the form of an epitaxial layer within a trench (not illustrated) formed in the substrate 110. That is, the shape of each of the first through fourth source-drain regions 114 through 414 is not limited to the one illustrated in the drawing.

An interlayer insulating film 120 may include a plurality of trenches formed on the first through fourth areas I through IV of the substrate 110, respectively. In addition, the first through fourth spacers 122 through 422 may be disposed on both sides of the trenches, respectively.

Each of the first through fourth spacers 122 through 422 may include at least one of a nitride layer and an oxynitride layer. In addition, each of the first through fourth spacers 122 through 422 may have an 'L' shape or an 'I' shape, unlike the shape illustrated in the drawing.

The first through fourth interface layers 132 through 432 and the first through fourth gate stacks 160 through 460 may be sequentially formed in the trenches formed on the first through fourth areas I through IV of the substrate 110, respectively.

The first through fourth interface layers 132 through 432 can prevent poor interfaces between the substrate 110 and the first through fourth high-k layers 134 through 434, respectively. Each of the first through fourth interface layers 132 through 432 may include a low-k material layer having a dielectric constant (k) of 9 or less such as a silicon oxide layer (k is approximately 4) or a silicon oxynitride layer (k is approximately 4 to 8 according to contents of oxygen atoms and nitrogen atoms). Alternatively, each of the first through fourth interface layers 132 through 432 may be made of silicate or any combination of the above example layers.

Each of the first through fourth high-k layers 134 through 434 may be made of a high-k material. In some embodiments, each of the first through fourth high-k layers 134 through 434 may be made of a material such as, but not limited to, $HfO_2$, $Al_2O_3$, $ZrO_2$, or $TaO_2$.

Referring back to FIG. 1, the first through fourth high-k layers 134 through 434 may extend in a first direction (e.g., a vertical direction in FIG. 1) along sidewalls of the first through fourth spacers 122 through 422, respectively. In the current embodiment, the first through fourth high-k layers 134 through 434 are shaped as described above because they are formed by a replacement process (or a gate last process). However, embodiments are not limited thereto, and the shape of each of the first through fourth high-k layers 134 through 434 can be changed as desired. That is, in some other embodiments, the first through fourth high-k layers 134 through 434 may be formed by a gate first process. In this case, the first through fourth high-k layers 134 through 434 may not extend upward along the sidewalls of the first through fourth spacers 122 through 422, unlike in FIG. 1.

Referring back to FIG. 1, the first through fourth TiN layers 140 through 440 may be formed on the first through fourth high-k layers 134 through 434 of the first through fourth areas I through IV of the substrate 110, respectively. As described above, the first TiN layer 140 may have the first thickness T1, the second TiN layer 240 may have the second thickness T2, the third TiN layer 340 may have the third thickness T3, and the fourth TiN layer 440 may have the fourth thickness T4. The first through fourth thicknesses T1 through T4 may be different. Specifically, the second thickness T2 may be greater than the first thickness T1, the third thickness T3 may be greater than the second thickness T2, and the fourth thickness T4 may be greater than the second thickness T2 and smaller than the third thickness T3.

The first through fourth TiN layers 140 through 440 having different thicknesses may be formed by a bottom anti-reflective coating (BARC) process, which will be described in detail later.

Since the first through fourth TiN layers 140 through 440 include TiN as a work-function control material and have different thicknesses, the first through fourth transistors TR1 through TR4 may have different threshold voltages Vt1 through Vt4.

In the current embodiment, however, the first and second transistors TR1 and TR2 may be NMOS transistors, and the third and fourth transistors TR3 and TR4 may be p-channel metal oxide semiconductor (PMOS) transistors. In this case, the first and second transistors TR1 and TR2 formed on the first and second areas I and II of the substrate 110 may include the first and second TiN layers 140 and 240 relatively thinner than the third and fourth TiN layers 340 and 440 of the third and fourth transistors TR3 and TR4 formed on the third and fourth areas III and IV of the substrate 110.

That is, the first and second TiN layers 140 and 240 may be thicker than the third and fourth TiN layers 340 and 440. This is because TiN contained in the first through fourth TiN layers 140 through 440 is a P-type work function control material. Therefore, a TiN layer included in each of the PMOS transistors (i.e., the third and fourth transistors TR3 and TR4) is thicker than a TiN layer included in each of the NMOS transistors (i.e., the first and second transistors TR1 and TR2).

In addition, the first and third areas I and III of the substrate 110 may be relatively low-voltage areas, and the second and fourth areas II and IV may be relatively high-voltage areas. Therefore, the first transistor T1 formed in the first area I may be a low-voltage NMOS transistor, the second transistor TR2 formed in the second area II may be a high-voltage NMOS transistor, the third transistor TR3 formed in the third area III may be a low-voltage PMOS transistor, and the fourth transistor TR4 formed in the fourth area IV may be a high-voltage PMOS transistor.

That is, the threshold voltage Vt1 of the first transistor TR1 formed in the first area I may be lower than the threshold voltage Vt2 of the second transistor TR2 formed in the second area II. The threshold voltage Vt3 of the third transistor TR3 formed in the third area III may be lower than the threshold voltage Vt4 of the fourth transistor TR4 formed in the fourth area IV.

In embodiments, a case where the first and second areas I and II are n-channel field effect transistor (NFET) areas and the third and fourth areas III and IV are p-channel field effect transistor (PFET) areas is described. However, embodiments are not limited to this case. That is, the first through fourth areas I through IV can all be NFET areas or PFET areas. In addition, three or more areas can be NFET areas or PFET areas, and a threshold voltage of a transistor formed in each of the areas can be controlled by a TiN layer. In the current embodiment, two NFET areas and two PFET areas are illustrated. However, this is merely an example used to explain the technical spirit of the embodiments, which is not limited by this example.

Referring back to FIG. 1, the first through fourth gate metals 150 through 180 may respectively be formed on the first through fourth TiN layers 140 through 440 as described above. Specifically, the first gate metal 150 may include the first TiAlC layer 151, the first barrier layer 153 and the first metal layer 155 formed sequentially on the first TiN layer 140. The second gate metal 250 may include the second TiAlC layer 251, the second barrier layer 253 and the second metal layer 255 formed sequentially on the second TiN layer 240. The third gate metal 350 may include the third TiAlC layer 351, the third barrier layer 353 and the third metal layer 355 formed sequentially on the third TiN layer 340. The fourth gate metal 450 may include the fourth TiAlC layer 451, the fourth barrier layer 453 and the fourth metal layer 455 formed sequentially on the fourth TiN layer 440.

The first through fourth TiAlC layers 151 through 451 may include at least one of, e.g., TiAl, TiAlC, and TiAlN. The first through fourth barrier layers 153 through 453 may include, e.g., TiN and prevent a material included in the first through fourth metal layers 155 through 455 from diffusing to the first through fourth TiAlC layers 151 through 451. The first through fourth metal layers 155 through 455 may include Al or W and fill the remaining parts of the first through fourth trenches 130 through 430 on the first through fourth areas I through IV.

The first through fourth gate stacks 160 through 460 according to embodiments do not include lanthanum (La) and/or tantalum nitride (TaN) as a work function control material. Therefore, the threshold voltages Vt1 through Vt4 of the first through fourth transistors TR1 through TR4 may be controlled by the different thicknesses of the first through fourth TiN layers 140 through 440, respectively.

A method of fabricating a semiconductor device according to an embodiment will now be described with reference to FIGS. 2 through 13. FIGS. 2 through 13 are cross-sectional views illustrating steps of a method of fabricating a semiconductor device according to an embodiment.

Figure 2:
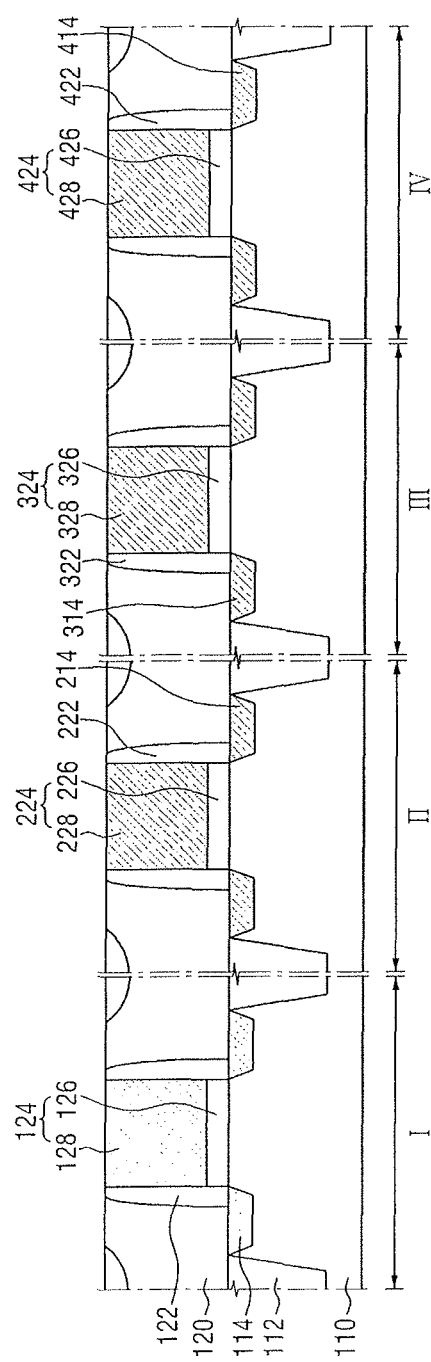
FIGS. 2 through 13 are cross-sectional views illustrating steps of a method of fabricating a semiconductor device according to an embodiment.

Referring to FIG. 2, a substrate 110 may include a first area I, a second area II, a third area III, and a fourth area IV. The first area I, the second area II, the third area III and the fourth area IV may be connected to or separated from each other. A device isolation layer 112 such as an STI layer may be formed in the substrate 110 to define active regions.

A first dummy gate structure 124 is formed on the first area I, a second dummy gate structure 224 is formed on the second area II, a third dummy gate structure 324 is formed on the third area III, and a fourth dummy gate structure 424 is formed on the fourth area IV.

The first dummy gate structure 124 may include a first dummy gate insulating layer 126 and a first dummy gate electrode 128. The second dummy gate structure 224 may include a second dummy gate insulating layer 226 and a second dummy gate electrode 228. The third dummy gate structure 324 may include a third dummy gate insulating layer 326 and a third dummy gate electrode 328. The fourth dummy gate structure 424 may include a fourth dummy gate insulating layer 426 and a fourth dummy gate electrode 428.

Each of the first through fourth dummy gate insulating layers 126 through 426 may be formed on the substrate 110 and may be, e.g., a silicon oxide layer. The first through fourth dummy gate electrodes 128 through 428 may be formed on the first through fourth dummy gate insulating layers 126 through 426, respectively. The first through fourth dummy gate electrodes 128 through 428 may include, for example, polysilicon.

First through fourth source-drain regions 114 through 414 are formed in the substrate 110 using the first through fourth dummy gate structures 124 through 424 as a mask. The first source-drain regions 114 are formed in the first area I, the second source-drain regions 214 are formed in the second area II, the third source-drain regions 314 are formed in the third area III, and the fourth source-drain regions 414 are formed in the fourth area IV. Each of the first through fourth source-drain regions 114 through 414 may be formed on at least one side of a corresponding one of the first through fourth dummy gate structures 124 through 424.

First through fourth spacers 122 through 422 are formed on sidewalls of the first through fourth dummy gate structures 124 through 424, respectively. The first through fourth spacers 122 through 422 may include, for example, silicon oxide or silicon nitride. Each of the first through fourth spacers 122 through 422 may be formed on the sidewalls of a corresponding one of the first through fourth dummy gate structures 124 through 424 by forming a spacer layer (not illustrated) using, e.g., a chemical vapor deposition (CVD) process and etching back the spacer layer. Here, the shape of each of the first through fourth spacers 122 through 422 is not limited to the shape illustrated in the drawing.

Next, an interlayer insulating film 120 is formed on the substrate 110. The interlayer insulating film 120 may cover sidewalls of the first through fourth spacers 122 through 422 and expose top surfaces of the first through fourth dummy gate structures 124 through 424. To expose the top surfaces of the first through fourth dummy gate structures 124 through 424, a planarization process may be performed after the formation of the interlayer insulating film 120. Unlike the illustration in the drawing, the interlayer insulating film 120 can be formed by stacking two or more insulating layers.

Figure 3:
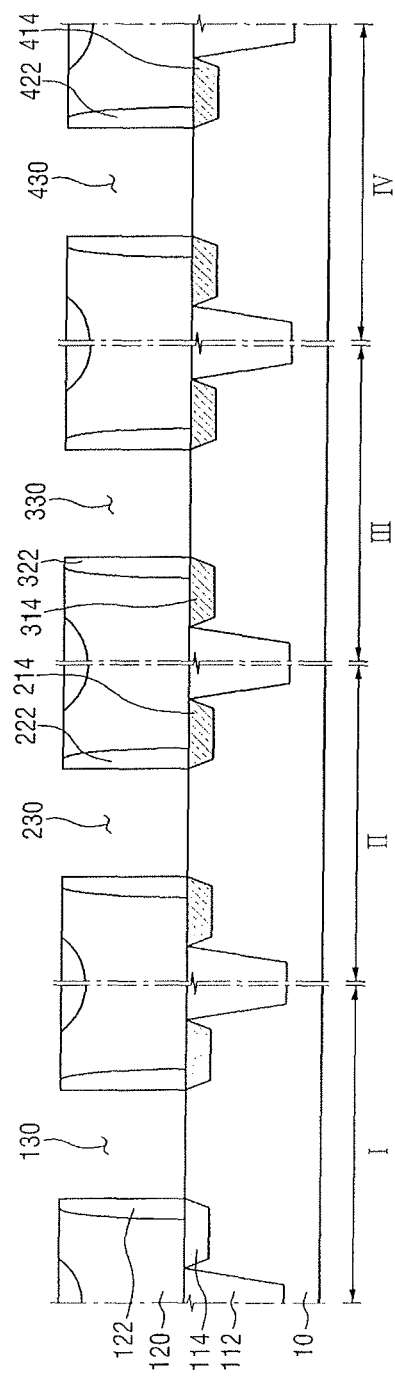

Referring to FIG. 3, the interlayer insulating film 120 is formed to have a first trench 130 on the first area I, a second trench 230 on the second area II, a third trench 330 on the third area III, and a fourth trench 430 on the fourth area IV. The first trench 130 may be formed by removing the first dummy gate structure 124, the second trench 230 may be formed by removing the second dummy gate structure 224, the third trench 330 may be formed by removing the third dummy gate structure 324, and the fourth trench 430 may be formed by removing the fourth dummy gate structure 424.

The first through fourth trenches 130 through 430 may respectively expose sidewalls of the first through fourth spacers 122 through 422 and a top surface of the substrate 110.

Figure 4:
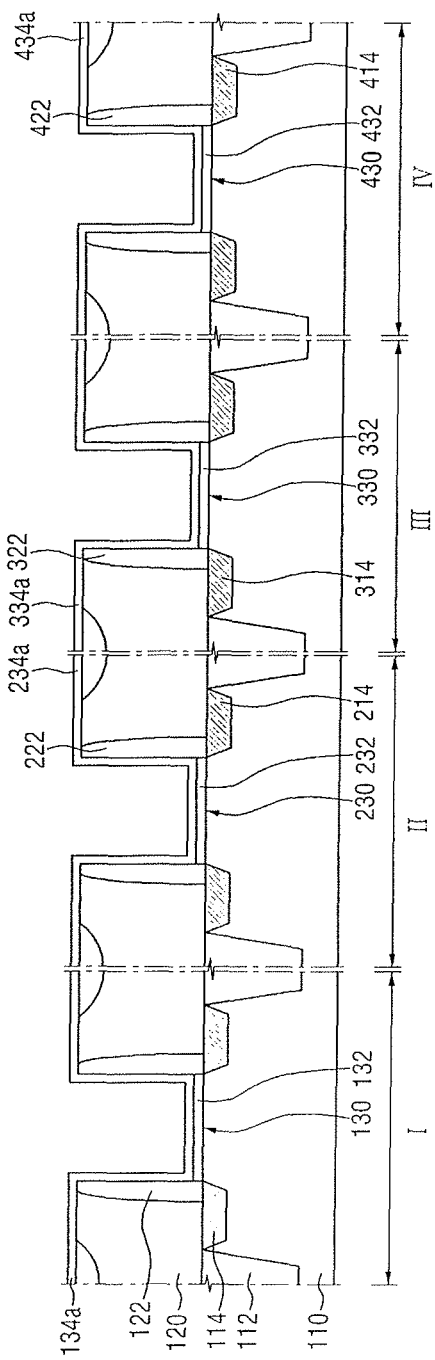

Referring to FIG. 4, a first interface layer 132 is formed on the top surface of the substrate 110 in the first trench 130, and a second interface layer 232 is formed on the top surface of the substrate 110 in the second trench 230. A third interface layer 332 is formed on the top surface of the substrate 110 in the third trench 330, and a fourth interface layer 432 is formed on the top surface of the substrate 110 in the fourth trench 430.

The first through fourth interface layers 132 through 432 may be formed by oxidizing the top surface of the substrate 110 exposed through the first through fourth trenches 130 through 430, but embodiments are not limited thereto. The first through fourth interface layers 132 through 432 may be formed along bottom surfaces of the first through fourth trenches 130 through 430, respectively.

Next, a first high-k layer 134a is formed in the first trench 130, a second high-k layer 234a is formed in the second trench 230, a third high-k layer 334a is formed in the third trench 330, and a fourth high-k layer 434a is formed in the fourth trench 430. Specifically, the first high-k layer 134a may be conformally formed along sidewalls and a bottom surface of the first trench 130, the second high-k layer 234a may be conformally formed along sidewalls and a bottom surface of the second trench 230, the third high-k layer 334a may be conformally formed along sidewalls and a bottom surface of the third trench 330, and the fourth high-k layer 434a may be conformally formed along sidewalls and a bottom surface of the fourth trench 430.

The first through fourth high-k layers 134a through 434a may also be formed on the interlayer insulating film 120.

The first through fourth high-k layers 134a through 434a may include a high-k material having a higher dielectric constant than a silicon oxide layer. For example, the first and second high-k layers 134a and 135a may include a material selected from the group consisting of HfSiON, $HfO_2$, $ZrO_2$, $Ta_2O_5$, $TiO_2$, $SrTiO_3$, and $(Ba,Sr)TiO_3$. Each of the first through fourth high-k layers 134a through 434a may be formed to an appropriate thickness according to the type of device to be formed.

Figure 5:
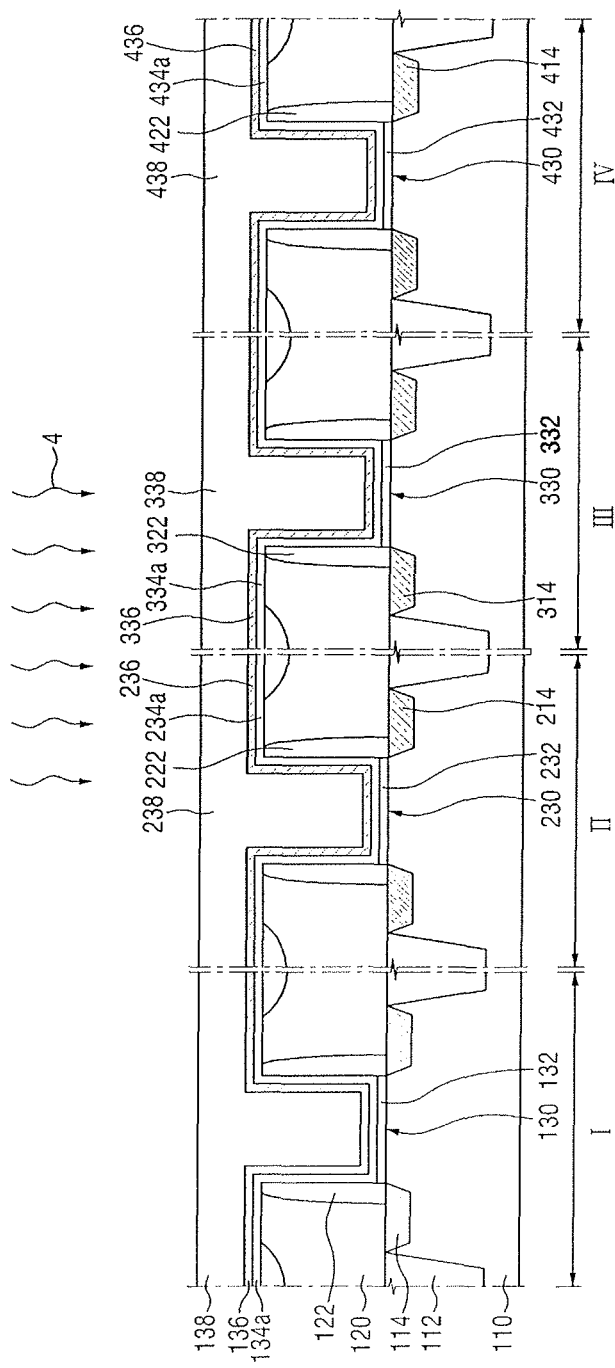

Referring to FIG. 5, first through fourth diffusion layers 136 through 436 and first through fourth blocking layers 138 through 438 are sequentially formed. The first diffusion layer 136 is formed in the first trench 130, the second diffusion layer 136 is formed in the second trench 230, the third diffusion layer 336 is formed in the third trench 330, and the fourth diffusion layer 436 is formed in the fourth trench 430.

The first through fourth diffusion layers 136 through 436 may be conformally formed along the sidewalls and bottom surfaces of the first through fourth trenches 130 through 430, respectively. The first through fourth diffusion layers 136 through 436 may include, but not limited to, TiN.

The first through fourth blocking layers 138 through 438 are formed on the first through fourth diffusion layers 136 through 436, respectively. The first through fourth blocking layers 138 through 438 may fill the first through fourth trenches 130 through 430 and may cover the first through fourth diffusion layers 136 through 436, respectively. The first through fourth blocking layers 138 through 438 may include, for example, Si.

Next, an annealing process 4 is performed. The first through fourth high-k layers 134a through 434a include oxygen atoms. The oxygen atoms may have been bonded with another material such as Hf, Zr, Ta or Ti. Here, the bonds between some of the oxygen atoms and the material may have been broken. The broken bonds may cause the generation of a leakage current, thus degrading the transistor performance. To prevent this problem, the annealing process 4 is performed to restore the broken bonds. The annealing process 4 causes the oxygen atoms contained in the first through fourth diffusion layers 136 through 436 to diffuse to the first through fourth high-k layers 134a through 434a, respectively.

If the first through fourth diffusion layers 136 through 436 are exposed during the annealing process 4, external oxygen atoms may permeate into the first through fourth diffusion layers 136 through 436. This increases the number of oxygen atoms moving to under the first through fourth diffusion layers 136 through 436. If more oxygen atoms than necessary are supplied to the first through fourth high-k layers 134a through 434a, excess oxygen atoms may react with the substrate 110 in the first through fourth trenches 130 through 430. Accordingly, the first through fourth interface layers 132 through 432 may become thicker, thus degrading the transistor performance. Therefore, the first through fourth blocking layers 138 through 438 should be formed on the first through fourth diffusion layers 136 through 436 to block the first through fourth diffusion layers 136 through 436 from the outside during the annealing process 4. In so doing, the amount of oxygen atoms supplied can be controlled appropriately.

The annealing process 4 may be performed at a temperature of 500 to 1500° C.

The thicknesses of the first through fourth diffusion layers 136 through 436 may vary according to the number of oxygen atoms to be supplied.

Figure 6:
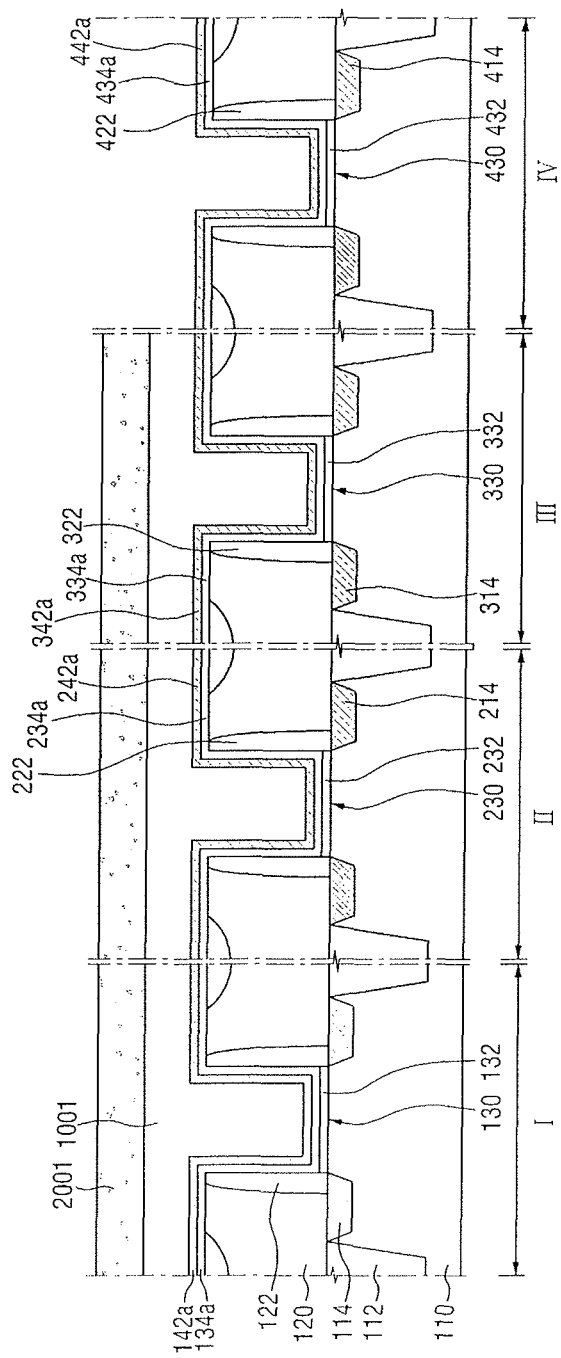

Referring to FIG. 6, the first through fourth blocking layers 138 through 438 and the first through fourth diffusion layers 136 through 436 are removed sequentially. Accordingly, the first through fourth high-k layers 134a through 434a may be exposed again. Then, first through fourth preliminary TiN layers 142a through 442a are formed on the first through fourth high-k layers 134a through 434a, respectively. The first through fourth preliminary TiN layers 142a through 442a may be conformally formed along the sidewalls and bottom surfaces of the first through fourth trenches 130 through 430, respectively. The first through fourth preliminary TiN layers 142a through 442a may include TiN.

Referring back to FIG. 6, a first mask pattern 1001 and a first photosensitive layer pattern 2001 are formed to cover the first through third preliminary TiN layers 142a through 342a and expose the fourth preliminary TiN layer 442a.

Specifically, a mask layer is formed on the first through fourth preliminary TiN layers 142a through 442 to fill the first through fourth trenches 130 through 430. The mask layer may also be formed on a top surface of the interlayer insulating film 120. The mask layer may be a BARC layer. In addition, the mask layer may include a material having excellent gap-fill properties in order to fill the first through fourth trenches 130 through 430 well. The mask layer that fills the first through fourth trenches 130 through 430 may be formed to directly contact the first through fourth preliminary TiN layers 142a through 442a.

Next, the first photosensitive layer pattern 2001 is formed on the mask layer. The first photosensitive layer pattern 2001 exposes the mask layer formed on the fourth preliminary TiN layer 442a but covers the mask layer formed on the first through third preliminary TiN layers 142a through 342a. That is, the first photosensitive layer pattern 2001 covers the first through third areas I through III and exposes the fourth area IV.

The mask layer that fills the fourth trench 430 is removed by an etching process using the first photosensitive layer pattern 2001 as a mask. The etching process results in the formation of the first mask pattern 1001 on the first through third preliminary TiN layers 142a through 342a. The first mask pattern 1001 fills the first through third trenches 130 through 330 and is a BARC pattern.

In other words, the mask layer formed on the fourth preliminary TiN layer 442a of the fourth area IV is removed using an etching process, thereby forming the first mask pattern 1001. The fourth preliminary TiN layer 442a is exposed by the first mask pattern 1001. That is, the fourth preliminary TiN layer 442a is exposed, and the first through third preliminary TiN layers 142a through 342a are covered by the first mask pattern 1002 and the first photosensitive layer pattern 2001. The first mask pattern 1001 and the first photosensitive layer pattern 2001 formed on the first through third preliminary TiN layers 142a through 342a form a stacked layer which can be used as an etch mask in a subsequent process.

The mask layer that fills the fourth trench 430 may be removed by a dry etching process. The dry etching process may be, for example, a reactive ion etching (RIE) process.

In an example of the dry etching process for forming the first mask pattern 1001, the mask layer that fills the fourth trench 430 is etched and removed using a mixed gas that contains oxygen as an etch gas. The mixed gas used as the etch gas contains chlorine in addition to oxygen. In addition, the mixed gas may further contain helium. In another example of the dry etching process for forming the first mask pattern 1001, the mask layer that fills the fourth trench 430 may be etched and removed using a mixed gas that contains nitrogen and hydrogen as an etch gas.

Figure 7:
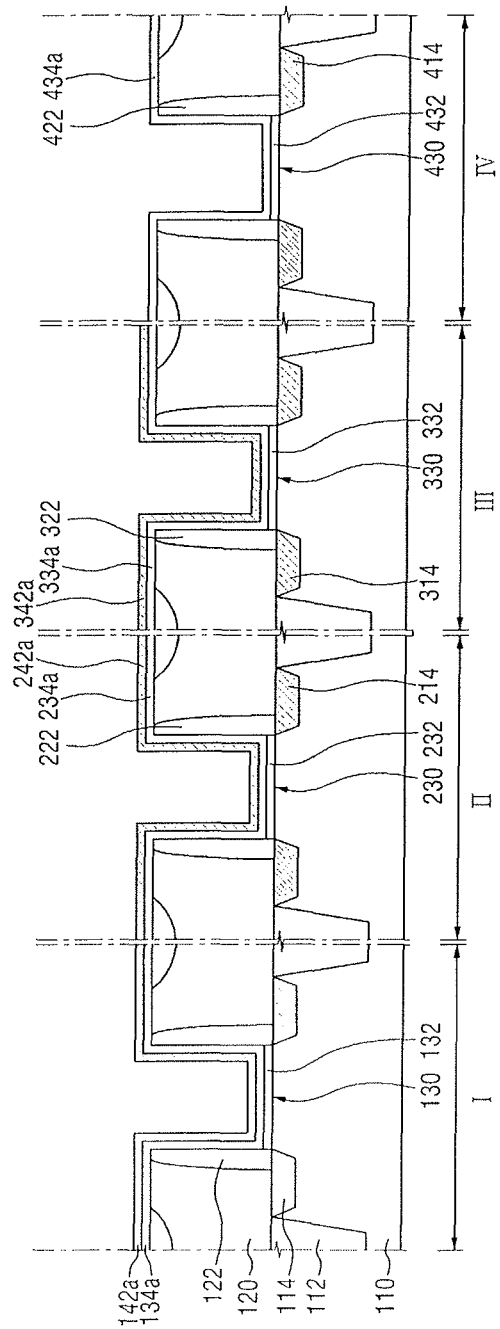

Referring to FIG. 7, the fourth preliminary TiN layer 442a is removed using the first mask pattern 1001 as a mask. Accordingly, the fourth high-k layer 434a may be exposed.

Specifically, the fourth preliminary TiN layer 442a formed along the sidewalls and bottom surface of the fourth trench 430 is removed using the stacked layer of the first mask pattern 1001 and the first photosensitive layer pattern 2001 as an etch mask.

The fourth preliminary TiN layer 442a may be removed using, e.g., a wet etching process. An etching solution used in the wet etching process may contain, but not limited to, hydrogen peroxide ($H_2O_2$). The wet etching process may be used to do less damage to the fourth high-k layer 434a which will be exposed in the process of removing the fourth preliminary TiN layer 442a.

Next, the first mask pattern 1001 and the first photosensitive layer pattern 2001 formed on the first through third preliminary TiN layers 142a through 342a are removed. The removal of the stacked layer of the first mask pattern 1001 and the first photosensitive layer pattern 2001 exposes the first through third preliminary TiN layers 142a through 342a.

For example, ashing and stripping processes may be performed on the first mask pattern 1001 and the first photosensitive layer pattern 2001 using a gas that contains hydrogen ($H_2$) and nitrogen ($N_2$).

Figure 8:
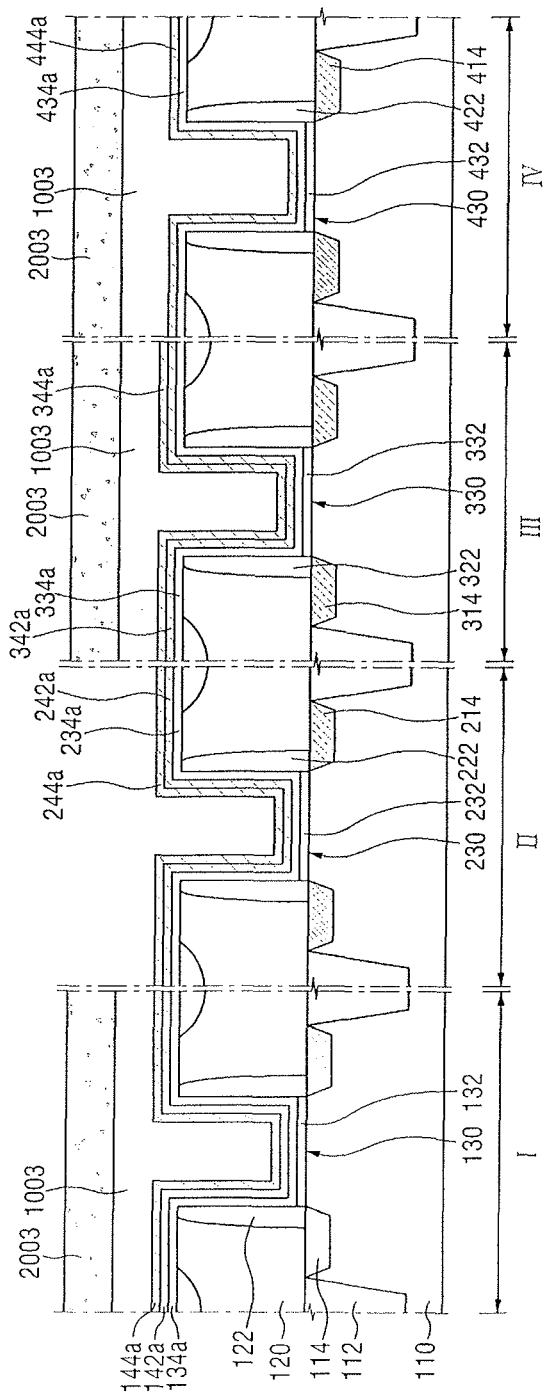

Referring to FIG. 8, fifth through seventh preliminary TiN layers 144a through 344a are respectively formed on the first through third preliminary TiN layers 142a through 342a, and an eighth preliminary TiN layer 444a is formed on the fourth high-k layer 434a. The fifth through eighth preliminary TiN layers 144a through 444a may be conformally formed along the sidewalls and bottom surfaces of the first through fourth trenches 130 through 430, respectively. The fifth through eighth preliminary TiN layers 144a through 444a may include TiN.

Next, a second mask pattern 1003 and a second photosensitive layer pattern 2003 are formed on the first, third and fourth areas I, III and IV. The second mask pattern 1003 and the second photosensitive layer pattern 2003 cover the fifth, seventh and eighth preliminary TiN layers 144a, 344a and 444a and expose the sixth preliminary TiN layer 244a. The second mask pattern 1003 and the second photosensitive layer pattern 2003 are substantially the same as the first mask pattern 1001 and the first photosensitive layer pattern 2001 described above, respectively, except that the second mask pattern 1003 and the second photosensitive layer pattern 2003 expose and cover different regions from the first mask pattern 1001 and the first photosensitive layer pattern 2001. Therefore, a redundant description of the second mask pattern 1003 and the second photosensitive layer pattern 2003 is omitted.

Figure 9:
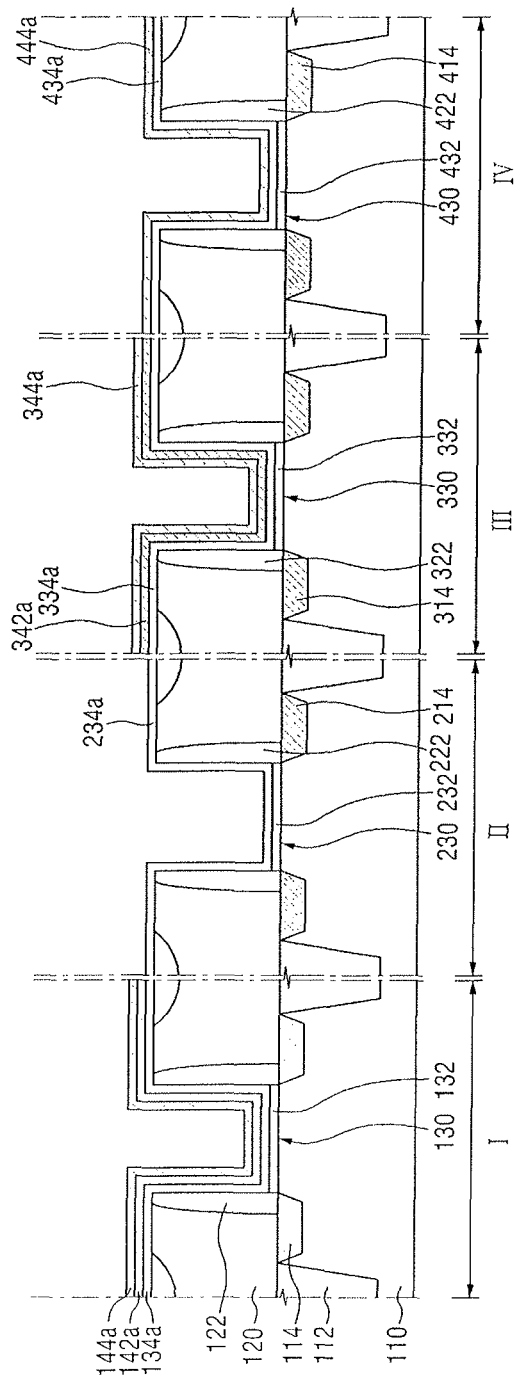

Referring to FIG. 9, the second and sixth preliminary TiN layers 242a and 244a are removed using the second mask pattern 1003 as a mask. Accordingly, the second high-k layer 234a may be exposed. Removing the second and sixth preliminary TiN layers 242a and 244a using the second mask pattern 1003 as a mask is substantially the same as removing the fourth preliminary TiN layer 442a using the first mask pattern 1001 as a mask except for the preliminary TiN layer or layers that are removed, and thus a redundant description thereof is omitted.

Through the steps of FIGS. 8 and 9, the first and fifth preliminary TiN layers 142a and 144a are formed on the first high-k layer 134a of the first area I, the second high-k layer 234a of the second area II is exposed, the third and seventh preliminary TiN layers 342a and 344a are formed on the third high-k layer 334a of the third area III, and the eighth preliminary TiN layer 444a is formed on the fourth high-k layer 434a of the fourth area IV.

Figure 10:
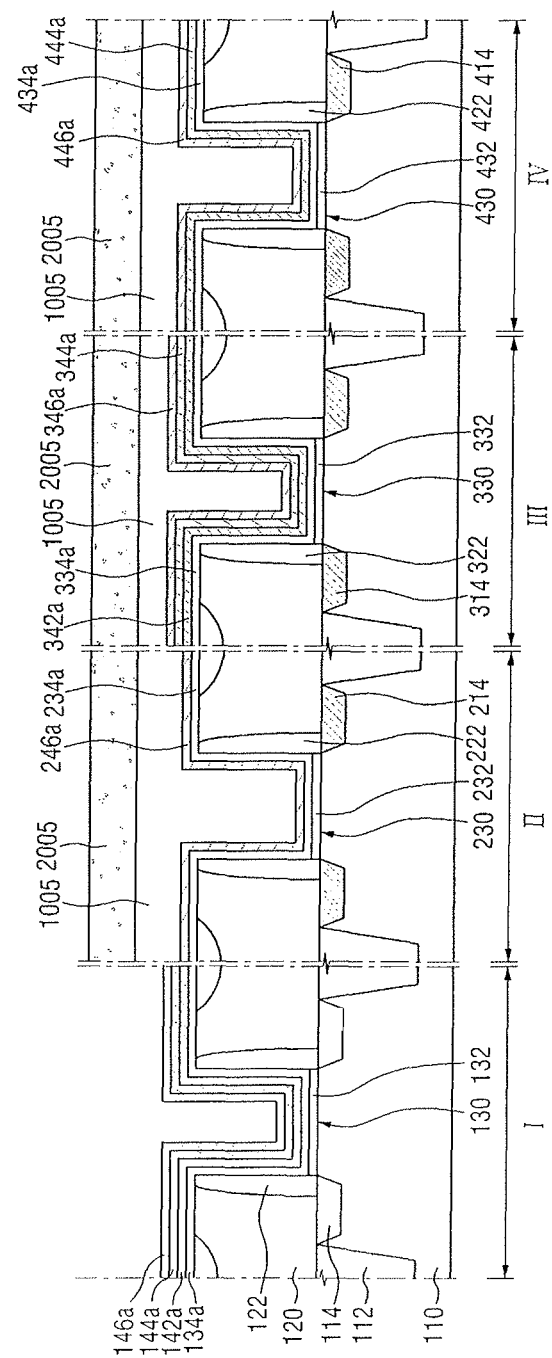

Referring to FIG. 10, ninth, eleventh and twelfth preliminary TiN layers 146a, 346a and 446a are respectively formed on the fifth, seventh and eighth preliminary TiN layers 144a, 344a and 444a, and a tenth preliminary TiN layer 246a is formed on the second high-k layer 234a. The ninth through twelfth preliminary TiN layers 146a through 446a may be conformally formed along the sidewalls and bottom surfaces of the first through fourth trenches 130 through 430, respectively. The ninth through twelfth preliminary TiN layers 146a through 446a may include TiN.

Next, a third mask pattern 1005 and a third photosensitive layer pattern 2005 are formed on the second through fourth areas II through IV. The third mask pattern 1005 and the third photosensitive layer pattern 2005 cover the tenth through twelfth preliminary TiN layers 246a through 446a and expose the ninth preliminary TiN layer 146a. The third mask pattern 1005 and the third photosensitive layer pattern 2005 are substantially the same as the first mask pattern 1001 and the first photosensitive layer pattern 2001 described above, respectively, except that the third mask pattern 1005 and the third photosensitive layer pattern 2005 expose and cover different regions from the first mask pattern 1001 and the first photosensitive layer pattern 2001. Therefore, a redundant description of the third mask pattern 1005 and the third photosensitive layer pattern 2005 is omitted Referring to FIG. 11, the first, fifth and ninth preliminary TiN layers 142a, 144a and 146a of the first area I are removed using the third mask pattern 1005 as a mask. Accordingly, the first high-k layer 134a may be exposed. Removing the first, fifth and ninth preliminary TiN layers 142a, 144a and 146a using the third mask pattern 1005 as a mask is substantially the same as removing the fourth preliminary TiN layer 442a using the first mask pattern 1001 as a mask except for the preliminary TiN layer or layers that are removed, and thus a redundant description thereof is omitted.

Figure 11:
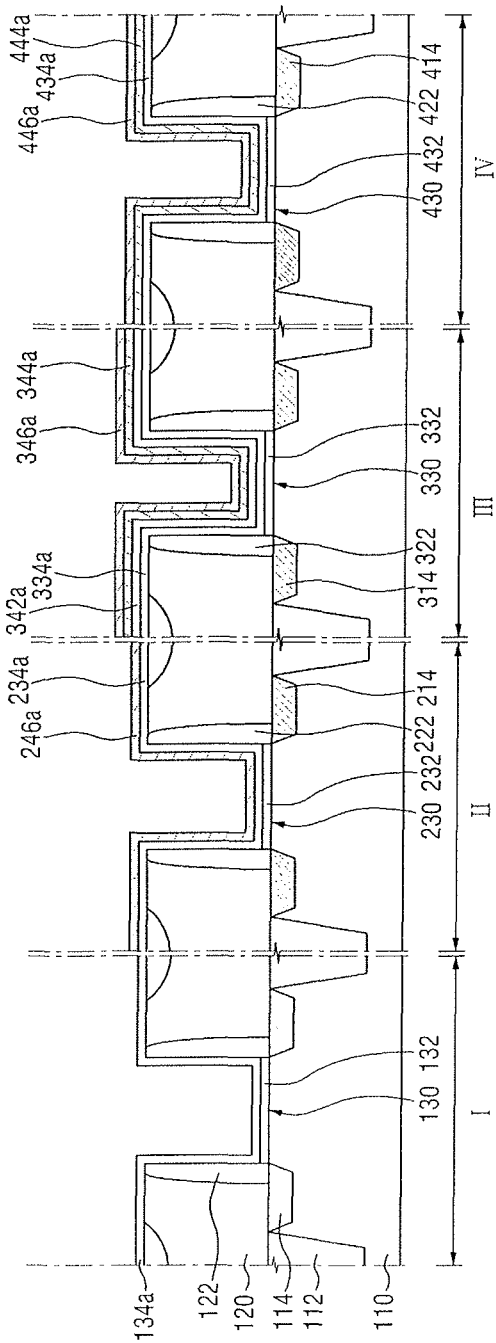

Through the steps of FIGS. 10 and 11, the first high-k layer 134a of the first area I is exposed, the tenth preliminary TiN layer 246a is formed on the second high-k layer 234a of the second area II, the third, seventh and eleventh preliminary TiN layers 342a, 344a and 346a are formed on the third high-k layer 334a of the third area III, and the eighth and twelfth preliminary TiN layers 444a and 446a are formed on the fourth high-k layer 434a of the fourth area IV.

Figure 12:
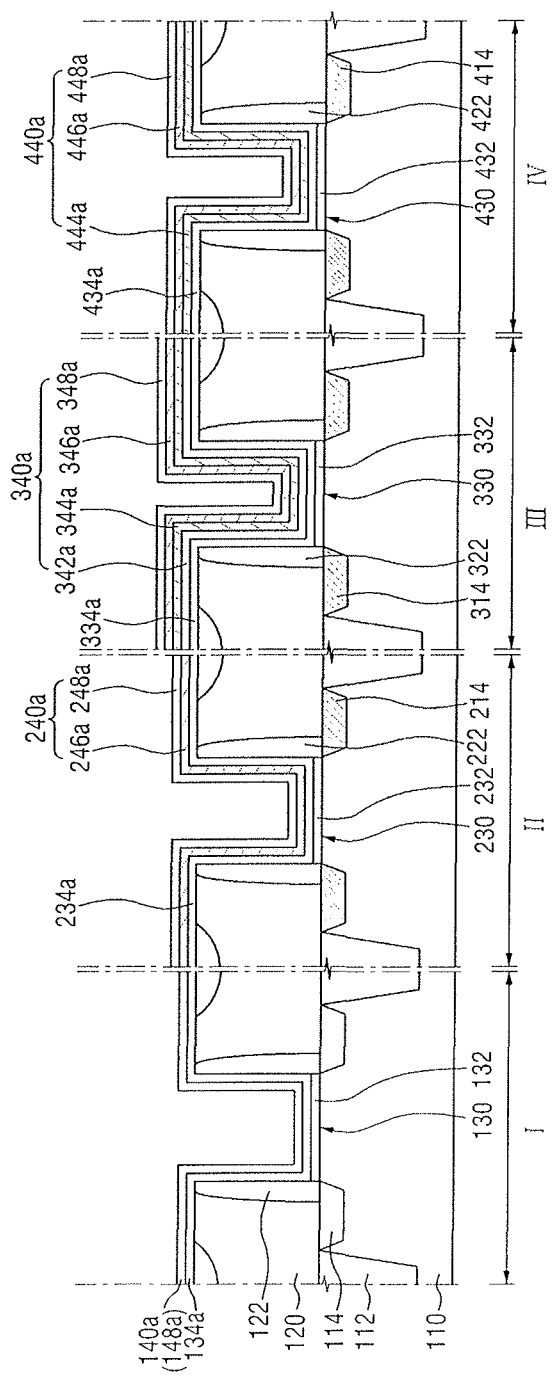

Referring to FIG. 12, a thirteenth preliminary TiN layer 148a is formed on the first high-k layer 134a, and fourteenth through sixteenth preliminary TiN layers 248a through 448a are formed on the tenth through twelfth preliminary TiN layers 246a through 446a, respectively.

The thirteenth through sixteenth preliminary TiN layers 148a through 448a may be conformally formed along the sidewalls and bottom surfaces of the first through fourth trenches 130 through 430, respectively. The thirteenth through sixteenth preliminary TiN layers 148a through 448a may include TiN.

Figure 13:
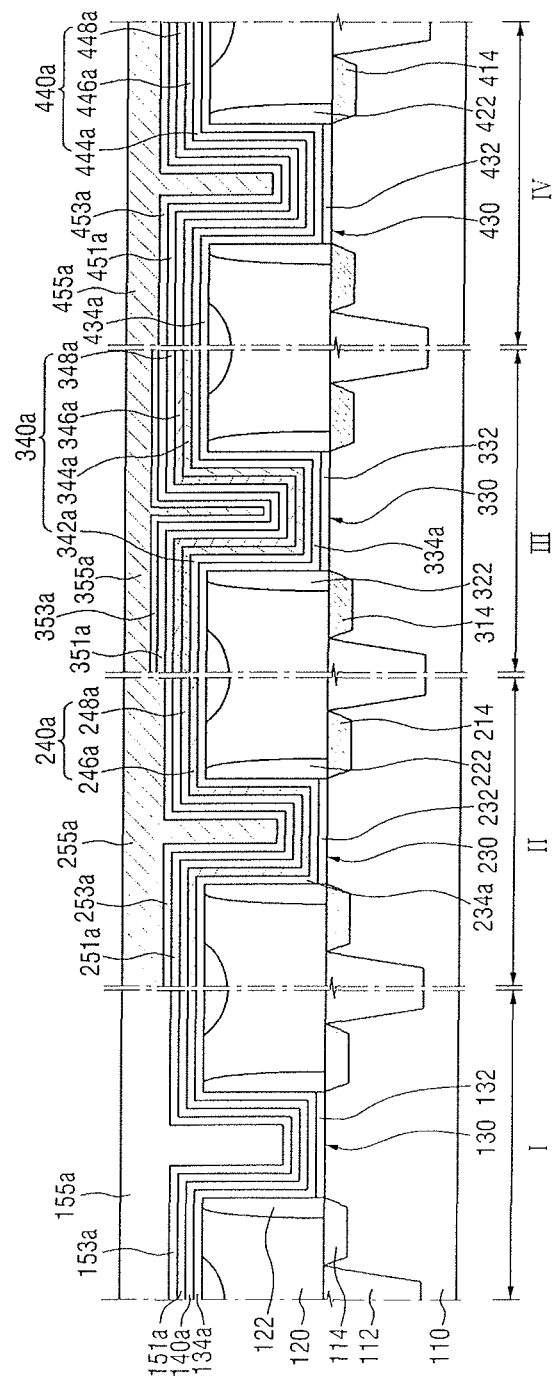

Referring to FIG. 13, first through fourth TiAlC layers 151a through 451a are formed on the first through fourth areas I through IV, respectively. The first through fourth TiAlC layers 151a through 451a may be conformally formed along the sidewalls and bottom surfaces of the first through fourth trenches 130 through 430, respectively. The first through fourth TiAlC layers 151a through 451a may be at least one of, e.g., TiAl, TiAlC, and TiAlN.

First through fourth barrier layers 153a through 453a are formed on the first through fourth TiAlC layers 151a through 451a, respectively. Specifically, the first through fourth barrier layers 153a through 453a may be conformally formed along the sidewalls and bottom surfaces of the first through fourth trenches 130 through 430, respectively. The first through fourth barrier layers 153a through 453a may include, for example, TiN. The first through fourth barrier layers 153a through 453a may prevent a material contained in the first through fourth metal layers 155a through 455a from diffusing into the first through fourth trenches 130 through 430.

The first through fourth metal layers 155a through 455a are formed on the first through fourth barrier layers 153a through 453a, respectively. The first through fourth metal layers 155a through 455a may fill the remaining parts of the first through fourth trenches 130 through 430. The first through fourth metal layers 155a through 455a may include, for example, Al or W.

Referring back to FIG. 1, first through fourth gate stacks 160 through 460 are formed. A planarization process is performed until the interlayer insulating film 120 is exposed. As a result, the first source-drain regions 114, the first spacers 122, the first interface layer 132 and the first gate stack 160 may be formed in the first area I of the substrate 110. Here, the first gate stack 160 may include a first high-k layer 134, a first TiN layer 140 having a first thickness T1, and a first gate metal 150. In addition, the first gate metal 150 may include a first TiAlC layer 151, a first barrier layer 153, and a first metal layer 155.

In the second area II of the substrate 110, the second source-drain regions 214, the second spacers 222, the second interface layer 232, and the second gate stack 260 may be formed. Here, the second gate stack 260 may include a second high-k layer 234, a second TiN layer 240 having a second thickness T2, and a second gate metal 250. In addition, the second gate metal 250 may include a second TiAlC layer 251, a second barrier layer 253, and a second metal layer 255.

In the third area III of the substrate 110, the third source-drain regions 314, the third spacers 322, the third interface layer 332, and the third gate stack 360 may be formed. Here, the third gate stack 360 may include a third high-k layer 334, a third TiN layer 340 having a third thickness T3, and a third gate metal 350. In addition, the third gate metal 350 may include a third TiAlC layer 351, a third barrier layer 353, and a third metal layer 355.

In the fourth area IV of the substrate 110, the fourth source-drain regions 414, the fourth spacers 422, the fourth interface layer 432, and the fourth gate stack 460 may be formed. Here, the fourth gate stack 460 may include a fourth high-k layer 434, a fourth TiN layer 440 having a fourth thickness T4, and a fourth gate metal 450. In addition, the fourth gate metal 450 may include a fourth TiAlC layer 451, a fourth barrier layer 453, and a fourth metal layer 455.

In the current embodiment, the first thickness T1 may be, but is not limited to, 8 to 16 Å, the second thickness T2 may be, but is not limited to, 16 to 24 Å, the third thickness T3 may be, but is not limited to, 24 through 50 Å, and the fourth thickness T4 may be, but is not limited to, 8 to 32 Å.

As described above, threshold voltages of first through fourth transistors TR1 through TR4 of embodiments are controlled according to thicknesses of the first through fourth TiN layers 140 through 440. Therefore, the first through fourth TiN layers 140 through 440 may be formed to various thicknesses as desired.

Figure 14:
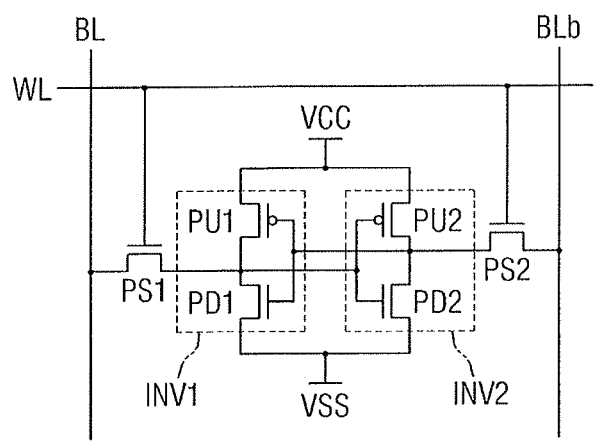
FIG. 14 is a circuit diagram of a semiconductor device according to other embodiments.
Figure 15:
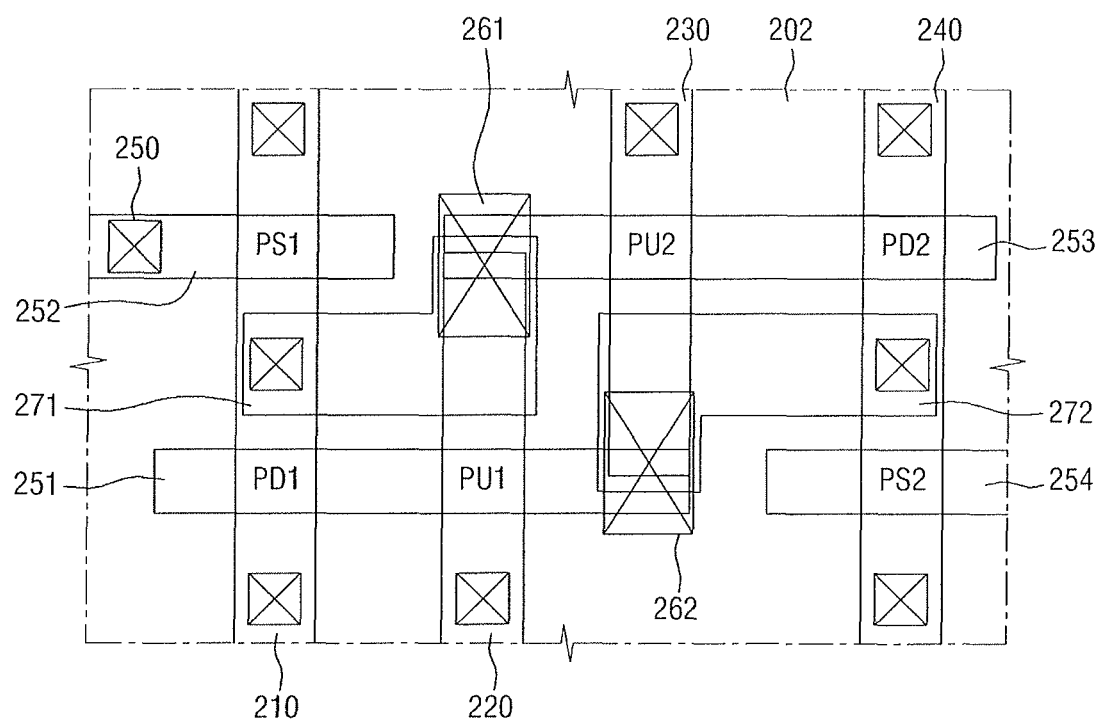
FIG. 15 is a layout diagram of the semiconductor device of FIG. 14.

FIG. 14 is a circuit diagram of a semiconductor device according to other embodiments. FIG. 15 is a layout diagram of the semiconductor device of FIG. 14.

For simplicity, a description of elements substantially identical to those of the previous embodiments will be omitted, and the current embodiment will hereinafter be described, focusing mainly on differences with the pervious embodiments.

Referring to FIGS. 14 and 15, the semiconductor device 10 may include a pair of first and second inverters INV1 and INV2 connected in parallel between a power source node VCC and a ground node VSS and first and second pass transistors PS1 and PS2 respectively connected to output nodes of the first and second inverters INV1 and INV2. The first and second pass transistors PS1 and PS2 may be connected to a bit line BL and a complementary bit line BLb, respectively. Gates of the first and second pass transistors PS1 and PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first and second pull-up transistors PU1 and PU2 may be PFETs, and the first and second pull-down transistors PD1 and PD2 may be NFETs.

An input node of the first inverter INV1 is connected to the output node of the second inverter INV2, and an input node of the second inverter INV2 is connected to the output node of the first inverter INV1 so as for the first and second inverters INV1 and INV2 to form a single latch circuit.

Referring again to FIGS. 14 and 15, a first active fin 210, a second active fin 220, a third active fin 230 and a fourth active fin 240 may extend in a direction (e.g., a vertical direction in FIG. 15) to be separated from each other. The second active fin 220 and the third active fin 230 may be shorter than the first active fin 210 and the fourth active fin 240.

In addition, a first gate electrode 251, a second gate electrode 252, a third gate electrode 253, and a fourth gate electrode 254 may extend in another direction (e.g., a horizontal direction in FIG. 15) to intersect the first through fourth active fins 210 through 240. Specifically, the first gate electrode 251 may completely intersect the first active fin 210 and the second active fin 220 and partially overlap an end of the third active fin 230. The third gate electrode 253 may completely intersect the fourth active fin 240 and the third active fin 230 and partially overlap an end of the second active fin 220. The second gate electrode 252 and the fourth gate electrode 254 may intersect the first active fin 210 and the fourth active fin 240, respectively.

The first pull-up transistor PU1 may be defined near the intersection of the first gate electrode 251 and the second active fin 220. The first pull-down transistor PD1 may be defined near the intersection of the first gate electrode 251 and the first active fin 210. The first pass transistor PS1 may be defined near the intersection of the second gate electrode 252 and the first active fin 210. The second pull-up transistor PU2 may be defined near the intersection of the third gate electrode 253 and the third active fin 230. The second pull-down transistor PD2 may be defined near the intersection of the third gate electrode 253 and the fourth active fin 240. The second pass transistor PS2 may be defined near the intersection of the fourth gate electrode 254 and the fourth active fin 240.

Although not specifically illustrated in the drawings, source/drain regions may be formed on both sides of each of the intersections between the first through fourth gate electrodes 251 through 254 and the first through fourth active fins 210 through 240, respectively. A plurality of contacts 250 may also be formed.

A first shared contact 261 may connect all of the second active fin 220, the third gate line 253, and a wiring layer 271. A second shared contact 262 may connect all of the third active fin 230, the first gate line 251, and a wiring layer 272.

The semiconductor device 5 may be used as, e.g., a static random access memory (SRAM). At least one transistor (PU1, PU2, PD1, PD2, PS1 or PS2) included in the semiconductor device 5 may employ the configurations according to the above-described embodiments. For example, the first and second pass transistors PS1 and PS2 illustrated in FIG. 15 may be configured in the form of any one of the transistors TR1 through TR4 illustrated in FIG. 1. The first and second pull-down transistors PD1 and PD2 illustrated in FIG. 15 may be configured in the form of another one of the transistors TR1 through TR4 illustrated in FIG. 1. In addition, the first and second pull-up transistors PU1 and PU2 illustrated in FIG. 15 may be configured in the form of any one of the transistors TR1 through TR4 illustrated in FIG. 1.

Figure 16:
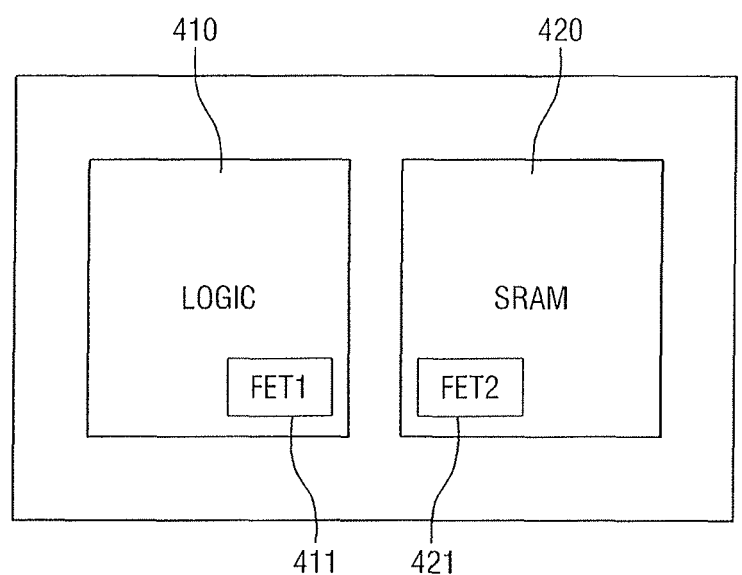
FIG. 16 is a block diagram of a semiconductor device according to other embodiments.
Figure 17:
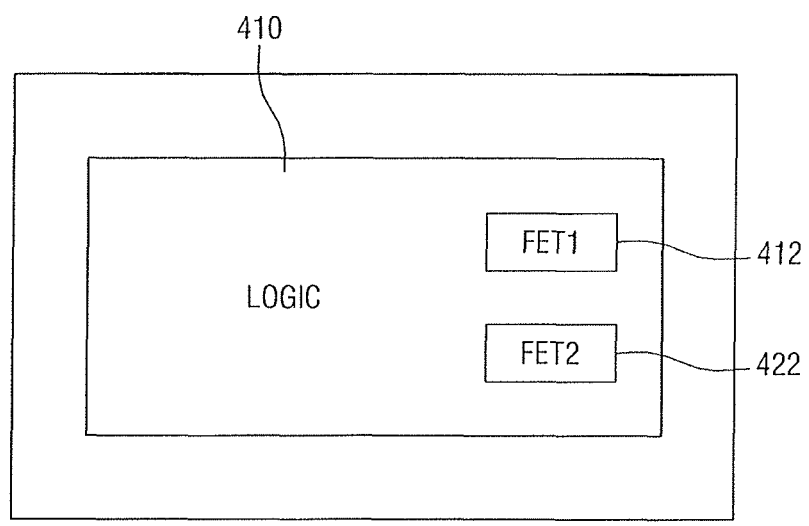
FIG. 17 is a block diagram of a semiconductor device according to other embodiments.

FIG. 16 is a block diagram of a semiconductor device according to other embodiments. FIG. 17 is a block diagram of a semiconductor device according to other embodiments. For simplicity, a description of elements substantially identical to those of the previous embodiments will be omitted, and the current embodiment will hereinafter be described, focusing mainly on differences with the pervious embodiments.

Referring to FIG. 16, the semiconductor device 13 may include a logic region 410 and an SRAM region 420. An eleventh transistor 411 may be disposed in the logic region 410, and a twelfth transistor 421 may be disposed in the SRAM region 420.

In some embodiments, a threshold voltage of the eleventh transistor 411 may be higher than that of the twelfth transistor 421. Accordingly, if the first transistor TR1 illustrated in FIG. 1 is employed as the eleventh transistor 411, any one of the second through fourth transistors TR2 through TR4 illustrated in FIG. 1 may be employed as the twelfth transistor 421.

Referring to FIG. 17, the semiconductor device 14 may include a logic region 410. Thirteenth and fourteenth transistors 412 and 422 which are different from each other may be disposed in the logic region 410. Although not specifically illustrated in the drawing, the thirteenth and fourteenth transistors 412 and 422 which are different from each other may also be disposed in an SRAM region.

In some embodiments, a threshold voltage of the thirteenth transistor 412 may be higher than that of the fourteenth transistor 422. Accordingly, if the first transistor TR1 illustrated in FIG. 1 is employed as the thirteenth transistor 412, any one of the second through fourth transistors TR2 through TR4 illustrated in FIG. 1 may be employed as the fourteenth transistor 422.

In FIG. 17, the logic region 410 and the SRAM region 420 are illustrated as an example, but embodiments are not limited to this example. Embodiments are also applicable to the logic region 410 and a region where another memory (e.g., DRAM, MRAM, RRAM, PRAM, etc.) is formed.

Figure 18:
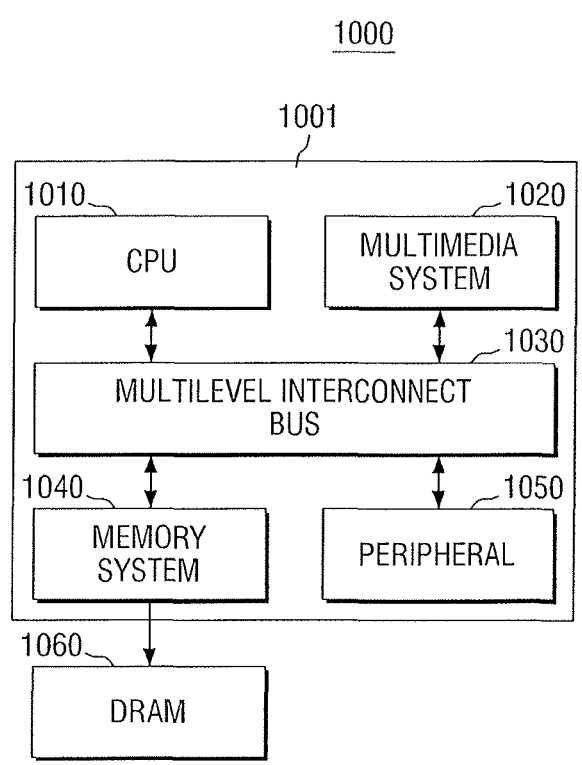
FIG. 18 is a block diagram of a system-on-chip (SoC) system including semiconductor devices according to embodiments.

FIG. 18 is a block diagram of a system-on-chip (SoC) system including semiconductor devices according to embodiments.

Referring to FIG. 18, the SoC system 1000 includes an application processor 1001 and a dynamic random access memory (DRAM) 1060.

The application processor 1001 may include a central processing unit (CPU) 1010, a multimedia system 1020, a bus 1030, a memory system 1040, and a peripheral circuit 1050.

The CPU 1010 may perform operations needed to drive the SoC system 1000. In some embodiments, the CPU 1010 may be configured as a multi-core environment including a plurality of cores.

The multimedia system 1020 may be used to perform various multimedia functions in the SoC system 1000. The multimedia system 1020 may include a 3D engine module, a video codec, a display system, a camera system, and a post-processor.

The bus 1030 may be used for data communication among the CPU 1010, the multimedia system 1020, the memory system 1040 and the peripheral circuit 1050. In some embodiments, the bus 1030 may have a multilayer structure. Specifically, the bus 1030 may be, but is not limited to, a multilayer advanced high-performance bus (AHB) or a multilayer advanced extensible interface (AXI).

The memory system 1040 may provide an environment needed for the application processor 1001 to be connected to an external memory (e.g., the DRAM 1060) and operate at high speed. In some embodiments, the memory system 1040 may include a controller (e.g., a DRAM controller) for controlling the external memory (e.g., the DRAM 1060).

The peripheral circuit 1050 may provide an environment needed for the SoC system 1000 to smoothly connect to an external device (e.g., mainboard). Accordingly, the peripheral circuit 1050 may include various interfaces that enable the external device connected to the SoC system 1000 to be compatible with the SoC system 1000.

The DRAM 1060 may function as a working memory needed for the operation of the application processor 1001. In some embodiments, the DRAM 1060 may be placed outside the application processor 1001 as illustrated in the drawing. Specifically, the DRAM 1060 may be packaged with the application processor 1001 in the form of package on package (PoP).

At least one of the elements of the SoC system 1000 may employ any one of the semiconductor devices according to the above-described embodiments.

Figure 19:
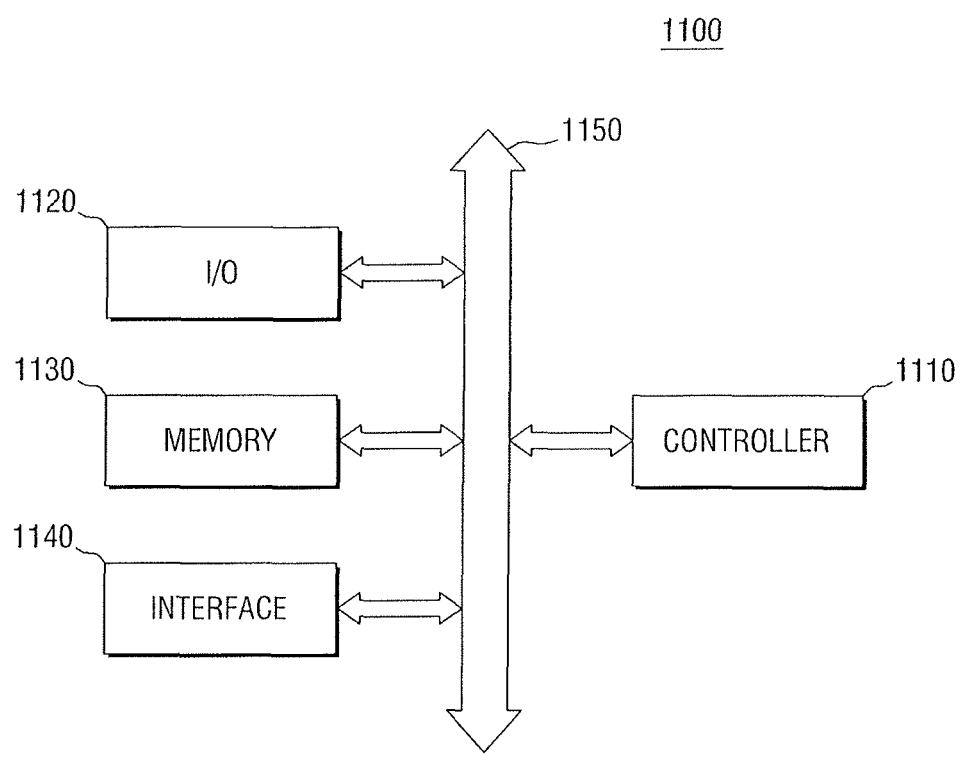
FIG. 19 is a block diagram of an electronic system including semiconductor devices according to embodiments.

FIG. 19 is a block diagram of an electronic system including semiconductor devices according to embodiments.

Referring to FIG. 19, the electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. In an example, the interface 1140 may include an antenna or a wired or wireless transceiver.

Although not illustrated in the drawing, the electronic system 1100 may be a working memory for improving the operation of the controller 1110, and may further include a high-speed DRAM or SRAM. Here, any one of the semiconductor devices according to the above-described embodiments may be employed as the working memory. In addition, any one of the semiconductor devices according to the above-described embodiments may be provided in the memory device 1130 or in the controller 1110 or the I/O device 1120.

The electronic system 1100 may be applied to nearly all types of electronic products capable of transmitting and/or receiving information in a wireless environment, such as a personal data assistant (PDA), a portable computer, a web tablet, a wireless phone, a mobile phone, a digital music player, a memory card, etc.

Figure 20:
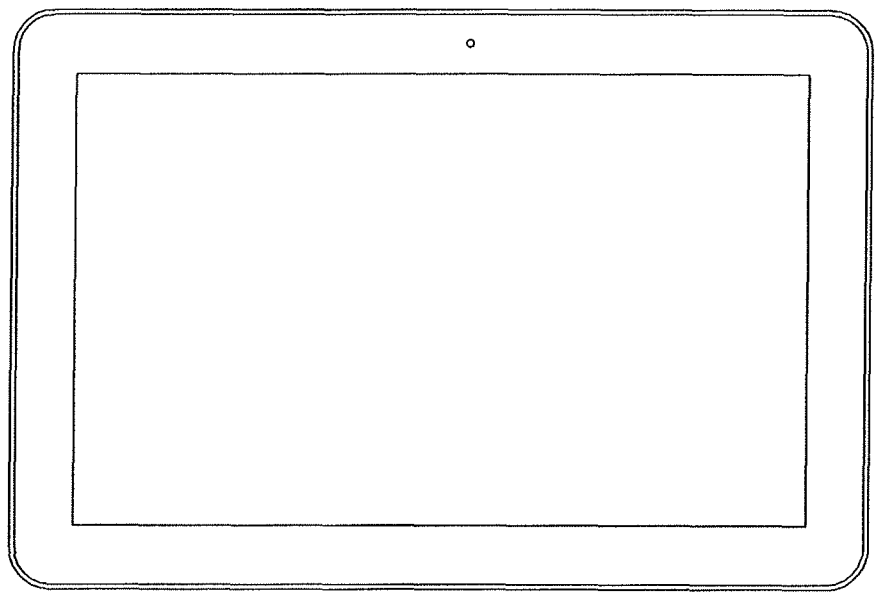
FIGS. 20 through 22 are diagrams illustrating examples of a semiconductor system including semiconductor devices according to embodiments.
Figure 21:
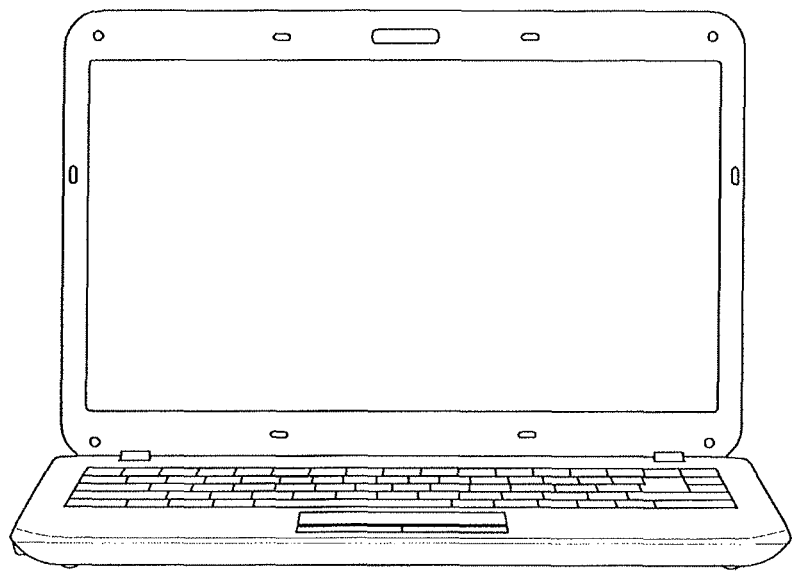
Figure 22:
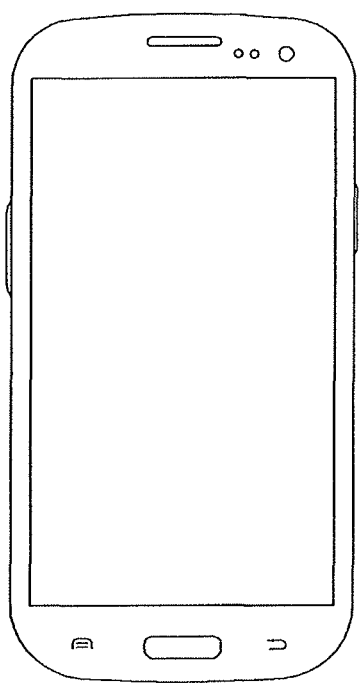

FIGS. 20 through 22 are diagrams illustrating examples of a semiconductor system to which semiconductor devices according to embodiments can be applied.

FIG. 20 illustrates a tablet personal computer (PC) 1200, FIG. 21 illustrates a notebook computer 1300, and FIG. 22 illustrates a smartphone 1400. At least one of the semiconductor devices according to the above-described embodiments, as set forth herein, may be used in the tablet PC 1200, the notebook computer 1300, and the smartphone 1400.

The semiconductor devices according to the embodiments, as set forth herein, may also be applied to various IC devices other than those set forth herein. That is, while the tablet PC 1200, the notebook computer 1300, and the smartphone 1400 have been described above as examples of the semiconductor system according to the current embodiment, the examples of the semiconductor system according to the current embodiment are not limited to the tablet PC 1200, the notebook computer 1300, and the smartphone 1400. In some embodiments, the semiconductor system may be provided as a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

While embodiments have been particularly shown and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A semiconductor device, comprising:
a substrate including a first, a second, a third, a fourth areas;
a first, a second, a third, a fourth gate stacks on the first through fourth areas of the substrate, respectively,
wherein the first gate stack includes a first high-dielectric constant (k) layer on the substrate, a first TiN layer on the first high-k layer to contact the first high-k layer and has a first thickness, and a first gate metal on the first TiN layer,
wherein the second gate stack includes a second high-k layer on the substrate, a second TiN layer on the second high-k layer to contact the second high-k layer and has a second thickness, and a second gate metal on the second TiN layer,
wherein the third gate stack includes a third high-k layer on the substrate, a third TiN layer on the third high-k layer to contact the third high-k layer and has a third thickness, and a third gate metal on the third TiN layer, and
wherein the fourth gate stack includes a fourth high-k layer on the substrate, a fourth TiN layer on the fourth high-k layer to contact the fourth high-k layer and has a fourth thickness, and a fourth gate metal on the fourth TiN layer, wherein the first through fourth thicknesses are different.

2. The semiconductor device of claim 1, wherein:
the first and second areas are n-channel field effect transistor (NFET) areas,
the third and fourth areas are p-channel field effect transistor (PFET) areas, and
the first and second thicknesses are smaller than the third and fourth thicknesses.

3. The semiconductor device of claim 1, wherein:
the first gate metal includes a first TiAlC layer, a first barrier layer, and a first metal layer,
the second gate metal includes a second TiAlC layer, a second barrier layer, and a second metal layer,
the third gate metal includes a third TiAlC layer, a third barrier layer, and a third metal layer, and
the fourth gate metal includes a fourth TiAlC layer, a fourth barrier layer, and a fourth metal layer.

4. The semiconductor device of claim 3, wherein the first TiAlC layer contacts the first TiN layer, the second TiAlC layer contacts the second TiN layer, the third TiAlC layer contacts the third TiN layer, and the fourth TiAlC layer contacts the fourth TiN layer.

5. The semiconductor device of claim 4, wherein the first through fourth gate metals do not includes lanthanum (La) and tantalum nitride (TaN).

6. The semiconductor device of claim 1, further comprising first through fourth interface layers between the substrate and the first through fourth high-k layers, respectively.

7. The semiconductor device of claim 1, wherein the first through fourth gate stacks define first through fourth transistors, respectively, the first through fourth transistors having different threshold voltages.

8. The semiconductor device of claim 7, wherein:
the respective threshold voltages of the first and second transistors in the first and second areas increase as the first and second TiN layers become thicker, and
the respective threshold voltages of the third and fourth transistors in the third and fourth areas decrease as the third and fourth TiN layers become thicker.

9. The semiconductor device of claim 1, wherein the first through fourth high-k layers extend upward along bottom and sidewalls of the first through fourth metal gate stacks, respectively.

10. A semiconductor device, comprising:
a substrate which includes a low-voltage area and a high-voltage area;
first and third gate stacks on the low-voltage area; and
second and fourth gate stacks on the high-voltage area,
wherein the first gate stack includes a first high-k layer on the substrate, a first TiN layer on the first high-k layer to contact the first high-k layer and has a first thickness, and a first gate metal on the first TiN layer,
wherein the second gate stack includes a second high-k layer on the substrate, a second TiN layer on the second high-k layer to contact the second high-k layer and has a second thickness greater than the first thickness, and a second gate metal on the second TiN layer, wherein the third gate stack includes a third high-k layer on the substrate, a third TiN layer on the third high-k layer to contact the third high-k layer and has a third thickness greater than the second thickness, and a third gate metal on the third TiN layer, and wherein the fourth gate stack includes a fourth high-k layer on the substrate, a fourth TiN layer on the fourth high-k layer to contact the fourth high-k layer and has a fourth thickness greater than the second thickness and smaller than the third thickness, and a fourth gate metal on the fourth TiN layer.

11. The semiconductor device of claim 10, wherein:
the first gate metal includes a first TiAlC layer, a first barrier layer, and a first metal layer,
the second gate metal includes a second TiAlC layer, a second barrier layer, and a second metal layer,
the third gate metal includes a third TiAlC layer, a third barrier layer, and a third metal layer, and
the fourth gate metal includes a fourth TiAlC layer, a fourth barrier layer, and a fourth metal layer.

12. The semiconductor device of claim 11, wherein the first TiAlC layer contacts the first TiN layer, the second TiAlC layer contacts the second TiN layer, the third TiAlC layer contacts the third TiN layer, and the fourth TiAlC layer contacts the fourth TiN layer.

13. The semiconductor device of claim 12, wherein the first through fourth gate metals do not includes lanthanum (La) and tantalum nitride (TaN).

14. The semiconductor device of claim 10, wherein:
the first through fourth gate stacks define first through fourth transistors having different threshold voltages, respectively,
the first and second transistors are n-channel field effect transistor (NFET), and
the second and fourth transistors are p-channel field effect transistor (PFET).

15. The semiconductor device of claim 14, wherein:
the respective threshold voltages of the first and second transistors increase as the first and second TiN layers become thicker, and
the respective threshold voltages of the third and fourth transistors decrease as the third and fourth TiN layers become thicker.

16. A semiconductor device, comprising:
a first through fourth transistors, wherein:
the first transistor includes a first interface layer, a first high-k layer on the first interface layer, a first TiN layer on the first high-k layer to contact the first high-k layer and has a first thickness, and a first gate metal on the first TiN layer, the second transistor includes a second interface layer, a second high-k layer on the second interface layer, a second TiN layer on the second high-k layer to contact the second high-k layer and has a second thickness greater than the first thickness, and a second gate metal on the second TiN layer, the third transistor includes a third interface layer, a third high-k layer on the third interface layer, a third TiN layer on the third high-k layer to contact the third high-k layer and has a third thickness greater than the second thickness, and a third gate metal on the third TiN layer, and the fourth transistor includes a fourth interface layer, a fourth high-k layer on the fourth interface layer, a fourth TiN layer on the fourth high-k layer to contact the fourth high-k layer and has a fourth thickness greater than the second thickness and smaller than the third thickness, and a fourth gate metal on the fourth TiN layer, and the first through fourth gate metals do not include lanthanum (La) and tantalum nitride (TaN).

17. The semiconductor device of claim 16, wherein the first and second transistors are n-channel field effect transistor (NFET), the second and fourth transistors are p-channel field effect transistor (PFET), and a threshold voltage of the second transistor is higher than a threshold voltage of the first transistor, and a threshold voltage of the fourth transistor is higher than a threshold voltage of the third transistor.

18. The semiconductor device of claim 16, wherein the first gate metal includes a first TiAlC layer, a first barrier layer, and a first metal layer, the second gate metal includes a second TiAlC layer, a second barrier layer, and a second metal layer, the third gate metal includes a third TiAlC layer, a third barrier layer and a third metal layer, and the fourth gate metal includes a fourth TiAlC layer, a fourth barrier layer and a fourth metal layer.

19. The semiconductor device of claim 16, wherein the respective threshold voltages of the first through fourth transistors increase as the first through fourth TiN layers become thicker.

20. The semiconductor device of claim 16, wherein the respective threshold voltages of the first through fourth transistors decrease as the first through fourth TiN layers become thicker.

* * * * *